(12) United States Patent
Peake et al.

(10) Patent No.: US 9,006,822 B2
(45) Date of Patent: Apr. 14, 2015

(54) TRENCH-GATE RESURF SEMICONDUCTOR DEVICE AND MANUFACTURING METHOD

(71) Applicant: NXP B.V., Eindhoven (NL)

(72) Inventors: Steven Thomas Peake, Warrington (GB); Phil Rutter, Stockport (GB)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/659,678

(22) Filed: Oct. 24, 2012

(65) Prior Publication Data

US 2013/0146967 A1   Jun. 13, 2013

(30) Foreign Application Priority Data

Dec. 7, 2011  (EP) .................................... 11192472

(51) Int. Cl.
| | |
|---|---|
| H01L 29/66 | (2006.01) |
| H01L 29/06 | (2006.01) |
| H01L 29/78 | (2006.01) |
| H01L 29/10 | (2006.01) |
| H01L 29/417 | (2006.01) |
| H01L 29/423 | (2006.01) |

(52) U.S. Cl.
CPC ........ H01L 29/7813 (2013.01); H01L 29/0634 (2013.01); *H01L 29/0696* (2013.01); *H01L 29/1095* (2013.01); *H01L 29/41766* (2013.01); *H01L 29/42368* (2013.01); H01L 29/66727 (2013.01); H01L 29/66734 (2013.01)

(58) Field of Classification Search
CPC ............ H01L 29/7813; H01L 29/7802; H01L 29/0615; H01L 29/0634
USPC ........... 257/329, 330, 341, 492, 493, E29.257
See application file for complete search history.

(56) References Cited

U.S. PATENT DOCUMENTS

| | | | |
|---|---|---|---|
| 6,194,741 B1 * | 2/2001 | Kinzer et al. ................... 257/77 |
| 7,323,386 B2 * | 1/2008 | Yilmaz ......................... 438/268 |
| 7,361,953 B2 * | 4/2008 | Miura ........................... 257/330 |
| 7,534,683 B2 * | 5/2009 | Shenoy et al. ................ 438/270 |
| 7,999,312 B2 * | 8/2011 | Takaya et al. ................. 257/331 |
| 2002/0011639 A1 * | 1/2002 | Carlson et al. ................ 257/443 |
| 2006/0220156 A1 * | 10/2006 | Saito et al. .................... 257/409 |
| 2006/0244054 A1 | 11/2006 | Kobayashi |
| 2006/0289928 A1 | 12/2006 | Takaya et al. |
| 2008/0001217 A1 * | 1/2008 | Kawashima .................. 257/330 |
| 2008/0135929 A1 * | 6/2008 | Saito et al. .................... 257/330 |
| 2009/0140327 A1 * | 6/2009 | Hirao et al. ................... 257/328 |
| 2009/0256212 A1 * | 10/2009 | Denison et al. ............... 257/408 |
| 2010/0044786 A1 | 2/2010 | Inomata et al. |
| 2010/0264489 A1 * | 10/2010 | Ohta et al. .................... 257/334 |
| 2011/0254010 A1 * | 10/2011 | Zhang ............................. 257/66 |

FOREIGN PATENT DOCUMENTS

JP        2001 267570        9/2001
JP        2001267570 A   *   9/2001

OTHER PUBLICATIONS

Extended European Search Report for European patent appln. No. 11192472.6 (Mar. 28, 2012).

* cited by examiner

*Primary Examiner* — Jarrett Stark
*Assistant Examiner* — Mohammad M Hoque

(57) ABSTRACT

A trench-gate device with lateral RESURF pillars has an additional implant beneath the gate trench. The additional implant reduces the effective width of the semiconductor drift region between the RESURF pillars, and this provides additional gate shielding which improves the electrical characteristics of the device.

12 Claims, 3 Drawing Sheets

TRENCH-GATE RESURF SEMICONDUCTOR DEVICE AND MANUFACTURING METHOD

CROSS-REFERENCE TO RELATED APPLICATIONS

This application claims the priority under 35 U.S.C. §119 of European patent application no. 11192472.6, filed on Dec. 7, 2011, the contents of which are incorporated by reference herein.

The present invention relates generally to trench-gate RESURF devices. The invention relates for example to vertical trench-gate MOSFET RESURF devices.

A vertical trench-gate MOSFET device typically consists of an n-type substrate on which an epitaxial n-type layer defining a drift region is formed. Source regions are provided at the top of the substrate, separated by a gate trench, which is lined with a gate oxide over which is disposed a gate metallization layer. Each source region is likewise equipped with a source metallization layer, and the substrate is equipped with a drain metallization layer.

It is generally desirable to achieve both a high breakdown voltage (hereinafter referred to as "BV") and a low drain-source on-resistance (hereinafter referred to a "RON"). However, both of these parameters depend on the thickness and resistivity of the drift region in such a way that both the breakdown voltage and the RON of a power MOSFET device will increase as the dopant concentration in the drift region is decreased and/or the thickness of the drift region is increased.

There is thus a trade-off in power MOSFETs between breakdown voltage and RON. One way of reducing the specific on-resistance of a power MOSFET device without compromising the desired high breakdown voltage is through Reduced Surface Field (RESURF) technology. In a RESURF device, an additional layer of silicon doped with p-type impurities is provided. A RESURF MOSFET can have the same breakdown voltage as, and a lower specific on-resistance than, the more simple MOSFET due to the extra depletion of electrons that occurs from the drift region of the RESURF MOSFET when the device is in its off state. This extra depletion occurs as a result of the interaction of the drift region with the RESURF region, in addition to the normal depletion that occurs as a result of the interaction of the drift region and the source regions.

The extra depletion within the RESURF MOSFET reduces the maximum electric field that occurs at any point within the drift region. Specifically, given the application of the same voltage between the drain region and source region of the RESURF MOSFET with respect to the simple MOSFET, the resulting electric field within the drift region is lower at the junction for the RESURF MOSFET than for the simple MOSFET. This means that a RESURF MOSFET can have a lower RON than a comparable simple MOSFET having the same breakdown voltage. Super-junction RESURF technology is a means to even further improve the breakdown voltage versus RON trade-off in vertical power MOSFETS.

In one design, RESURF or SUPERJUNCTION technologies can use deep p-type pillars to achieve optimal 'flat' electric field distributions, which enable very low specific RON to be achieved.

An example of what can be achieved using deep p-type pillars is shown in the table below:

| | Doping of drift layer | width of drift layer | length of drift layer | Breakdown voltage |
|---|---|---|---|---|
| Classical p+/n/n+ diode | n = 1e15 | 12 µm | 40 µm | 145 V |
| Classical p+/p/n+ diode | p = 5e15 | 12 µm | 40 µm | 110 V |
| RESURF diode | n = 1e15<br>p = 5e15 | n − 10 µm<br>p − 2 µm | 40 µm | 780 V |

An example of known 1.5 µm trench MOS design is shown in FIG. 1. FIG. 1 does not show the metal contacts. The part of the structure shown in FIG. 1 has as the lowest level the epitaxial n-type semiconductor which forms the drift region. Beneath the drift region is the drain electrode.

Source electrodes which make contact with the source regions are also not shown.

The layers shown comprise a dielectric 1 (forming a gate dielectric area, a trench base area and a coating layer), source regions 2, a body PWELL region 3, a trench polysilicon region 4 forming the gate, an n-type polysilicon region 5, the p-type pillars 6 which are the RESURF regions and a moat region 7.

The dielectric 1 includes a region at the base of the trench polysilicon region 4 (which region 4 forms the gate), and this is a thick dielectric which shields the gate from the drain. The thinner lateral parts of the dielectric 1 form the gate dielectric between the gate 4 and the semiconductor body 3.

The drain is at the bottom of the vertical structure and electrons flow top to bottom.

The process flow comprises forming the silicon substrate with the epitaxial n-type layer 5 which defines the drift region.

The gate trench 4 is etched into the structure, and the gate oxide is formed, which defines the gate dielectric. The thicker dielectric is then formed at the bottom of the trench.

The n-type trench polysilicon region 4 is deposited, doped and annealed, and then etched back to the level of the top of the semiconductor (i.e. the level of the top of the source regions 2).

The body region 3 is then implanted and annealed. The body region extends laterally to the edge of the top part of the dielectric 1 (which has not yet been formed). The source region 2 is then implanted and annealed.

The top contact part of the dielectric, which is the part of the dielectric layer 1 on top of the gate trench, is then grown. The dielectric 1 is thus formed as three separate regions—the thin layer forming the gate dielectric, the thicker region beneath the gate polysilicon area 4, and the contact region over the gate.

The silicon is then etched to form the moat region 7 at the sides of the source regions 3. This moat region forms contact openings for lateral contact with the source regions 2.

The p-type RESURF regions 6 and the contact regions at the base of the moat 7 are then implanted. The dielectric 1 acts as a shield, so that the implantation does not affect the semiconductor body region. The p-type RESURF and contact regions are then annealed.

A metallisation is then deposited and patterned to form top-side source and gate contacts, and a drain contact is also formed. The gate contact connects to the trench polysilicon region 4 outside of the active (current flowing) area of the device. Typically, the gate metallisation contacts the gate polysilicon where the polysilicon has been patterned to form a polysilicon field plate on the surface. The contact to this field plate is patterned at the same time as the source and moat contacts. Alternatively, the method of contacting the gate polysilicon can be directly to the gate polysilicon in the trench network. The patterning of this contact is again at the same time as the source and moat contacts.

There is a design formula for the parameters shown in FIG. 1:

$$N_p W_p = N_n W_n \qquad (\text{Eq. 1})$$

Where:

$N_p$=p-type pillar doping
$N_n$=Epitaxial layer doping
$W_p$=Width of the p-type pillar
$W_n$=Width of the epitaxial layer between the p-type pillars This achieves the highest possible value of BV and the lowest possible RON.

In FIG. 2, the formula above is shown graphically and the graph is used to determine the optimal epitaxial layer doping values ($N_n$) as a function of epitaxial width ($W_n$) for the shown p-type pillar $N_p$ and $W_p$ values.

The structure in this example has a cell pitch of 1.5 µm and since the p-type pillar width is 0.5 µm, the epitaxial width Wn (i.e. the distance between adjacent pillars) is 1.0 µm.

From FIG. 2, the optimal epitaxial layer doping ($N_n$) is $5.5e16 \text{ cm}^{-3}$ for the width Wn=1.0. If the epitaxial width ($W_n$) is reduced, the epitaxial doping level ($N_n$) can be increased by following the plotted curve, to maintain the same value of Wn.Nn (which is chosen to match Wp.Np) and still achieve the same BV but also a lower specific RON.

Unfortunately, in a trench MOS structure, for the same cell pitch, there is limit to what can be achieved because of the presence of the trench network. Another limitation is ensuring that the deep p-type pillars are sufficiently distant from the channel to minimise threshold voltage spreads.

If the cell pitch can be reduced, the dynamic switching performance of the technology would deteriorate, possibly leading to higher switching Figure of Merits.

According to the invention there is provided a trench-gate semiconductor device, comprising:

a drain contact;

a semiconductor body over the drain contact which is doped with a first type of dopant;

a gate trench formed in the top of the semiconductor body;

a gate dielectric lining the gate trench;

a gate electrode formed in the gate trench;

source regions formed in the semiconductor body on opposite sides of the gate trench, separated from the gate electrode by the gate dielectric; and an implant well on each side of the gate trench, doped with a second type of dopant, of opposite polarity type to the first type of dopant of the semiconductor body, and extending more deeply into the semiconductor body than the gate trench, wherein the device further comprises a pillar region doped with the second type of dopant beneath the gate trench between the implant wells.

The invention provides an additional implant beneath the gate trench within a trench-gate MOS which uses lateral RESURF pillars. The additional implant reduces the effective width of the semiconductor drift region between the RESURF pillars, and this provides additional gate shielding which improves the electrical characteristics of the device. This additional implant forms an additional RESURF region.

The device can further comprise a contact region to the source regions, comprising a moat formed around the source regions extending into the top of the semiconductor body.

The pillar region can have a width of between 0.7 and 1.0 times the width of the gate trench, so that it occupies substantially the same width as the gate trench, and thereby reduce the effective width of the drift region as much as possible.

The pillar region preferably extends to a depth which is substantially equal to the depth of the implant wells.

In a preferred example, the semiconductor body is doped n-type, the implant wells and the pillar region are doped p-type.

The invention also provides a method of manufacturing a trench-gate semiconductor device, comprising:

forming a silicon substrate with an epitaxial layer doped with a first type of dopant, and which defines a device drift region;

etching a gate trench into the substrate;

forming a gate oxide against at least the side walls of the trench and forming a thicker gate oxide at the bottom of the trench;

implanting a pillar region beneath the gate trench doped with a second type of dopant of opposite type to the first type of dopant;

depositing, doping and annealing a gate electrode in the gate trench;

implanting and annealing a semiconductor body region on each side of the gate trench;

implanting and annealing source regions on each side of the gate trench over the semiconductor body region;

etching the semiconductor body region to form a moat region at the sides of the source regions to form contact openings for contact with the source regions;

implanting and annealing RESURF regions at the base of the moat; and depositing and patterning a metallisation layer to form source and gate contacts.

This method is used to form the device of the invention and requires only one additional implant step to form the pillars of the invention.

An example of the invention will now be described in detail with reference to the accompanying drawings, in which.

The invention provides an additional implant beneath the gate trench within a trench-gate MOS of the type described above. The additional implant reduces the effective width of the semiconductor drift region between the RESURF pillars, and this provides additional gate shielding which improves the electrical characteristics of the device.

Figure 1:
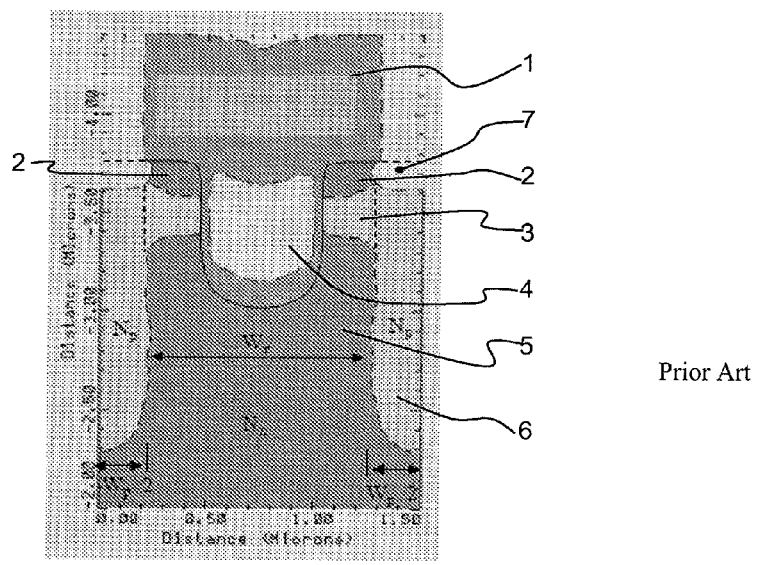
FIG. 1 shows a known vertical RESURF trench MOSFET.
Figure 3:
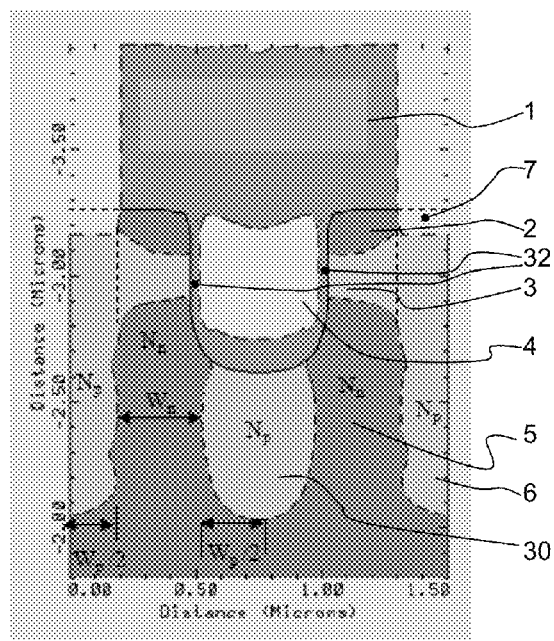
FIG. 3 shows a vertical RESURF trench MOSFET of the invention.

FIG. 3 shows how the invention is used to modify the known structure of FIG. 1, i.e. with the same cell pitch of 1.5 µm but an additional p-type pillar 30 is implanted into the trench base after oxide growth.

The additional pillar 30 is connected to the source bias, for example at the end of each trench stripe (or at regular intervals), where it merges with the high dose shallow (30 keV) p-type source region implant.

FIG. 3 also shows the gate oxide regions 32 of the dielectric layer 1.

The same reference numerals are used as in FIG. 1, and the structure is the same apart from the additional implant of the p-type polysilicon pillar 30.

Multiple p-type implants, typically Boron, can be used for this purpose, and are implanted at energies ranging from 120 keV to 260 keV to form a pillar with the same depth as the p-type RESURF pillars 6 implanted into the moat region 7.

Following the implants, the thermal budget is limited as much as possible to ensure that the lateral spread of the implanted Boron ions is minimised.

To implement the invention, the process described above is changed in only one respect, in that after creation of the thick dielectric at the bottom of the gate trench, the p-type pillar 30, which functions as an additional RESURF region, is implanted.

The process flow thus comprises:

forming the silicon substrate with an epitaxial layer (5) doped with a first type of dopant (typically n-type), and which defines a device drift region;

etching the gate trench into the substrate;

forming the gate oxide around the inside of the trench, including the sidewalls of the trench where the gate dielectric 32 will be formed;

forming a thicker gate oxide at the bottom of the trench;

implanting the pillar region 30 of the invention beneath the gate trench, and doped with a second type of dopant of opposite type to the first type of dopant (i.e. typically p-type);

depositing, doping and annealing the gate electrode 4 in the gate trench, followed by levelling;

implanting and annealing a semiconductor body region 3 on each side of the gate trench;

implanting and annealing the source regions 2 on each side of the gate trench over the semiconductor body region 3;

forming the top contact part of the dielectric 1;

etching the semiconductor body region 3 using the dielectric as a mask to form a moat region 7 at the sides of the source regions 2 to form contact openings for contact with the source regions 2;

implanting and annealing the RESURF regions 6 at the base of the moat 7; and depositing and patterning metallisation layers to form source and gate contacts and a drain contact.

The base of the drift region typically has a higher doping level to form a drain contact region adjacent the drain contact. This drain contact is formed at the end of the process, after thinning of the substrate layer. For example, 750 µm wafers can be processed, and then thinned to 150 µm prior to drain metallisation.

The additional pillar 30 is connected to the source potential. For this purpose, an additional implant of the second type (typically p-type) is used to make contact between the additional deep pillar 30 and the source regions. This is achieved by providing the additional p-type implant at the end of each gate trench stripe, and this enables the additional p-type RESURF region to be biased at source potential.

This additional p-type implant can be implanted at the beginning of the process to delineate the active area of the device from the edge termination. By providing the additional p-type implant all around the edge termination region, it provides connection across the underside of the trench, i.e. it makes lateral connection between the implants 30 and 6. The additional p-type implant thus extends under the trench.

Figure 4:
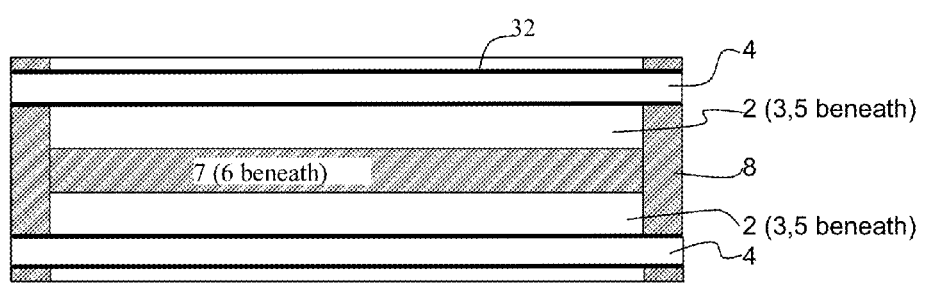
FIG. 4 shows the device of FIG. 3 in plan view.

FIG. 4 shows the structure in plan view.

Two gate trenches are shown, in which are formed the gate contacts 4. The source regions 2 (with the semiconductor body areas 3 and the drift regions 5 beneath) are on each side of each gate trench.

The moat area 7 is laterally outside the source regions and the RESURF implant wells 6 are beneath the moat area 7.

The gate trench is isolated by the gate dielectric so the gate is isolated from source potential. The additional implant 8 outside the active area connects the pillar 30 to the implant wells 6.

In the structure of the invention, the width ($W_n$) of the epitaxial layer between adjacent p-type RESURF pillars can be reduced to ~0.3 µm.

Figure 2:
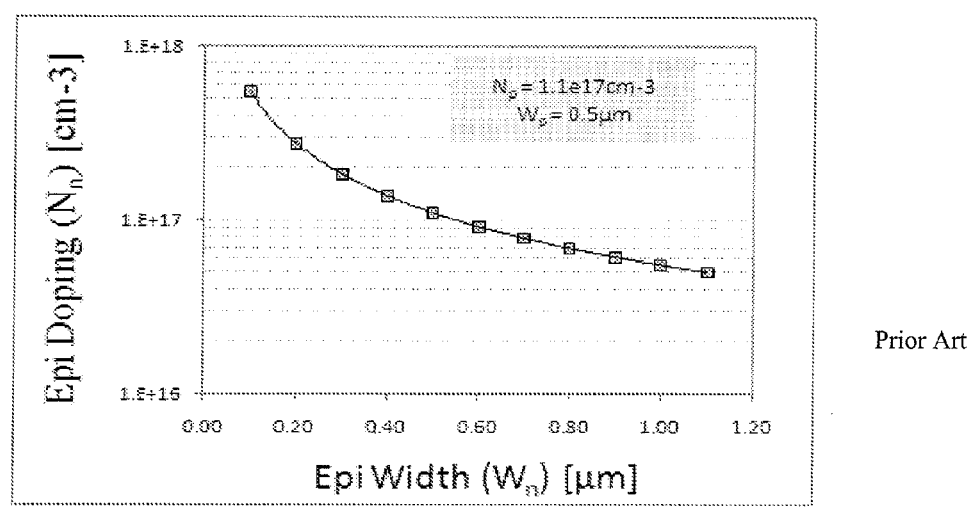
FIG. 2 shows graphically a relationship between the width of the epitaxial layer and the optimal doping level.

From Equation 1 and FIG. 2, this corresponds to an epitaxial doping ($N_n$) of ~1.5e17 cm$^{-3}$ for the same value of BV. This level of RESURF can be achieved without having to sacrifice cell pitch and switching performance.

Figures 5, 6:
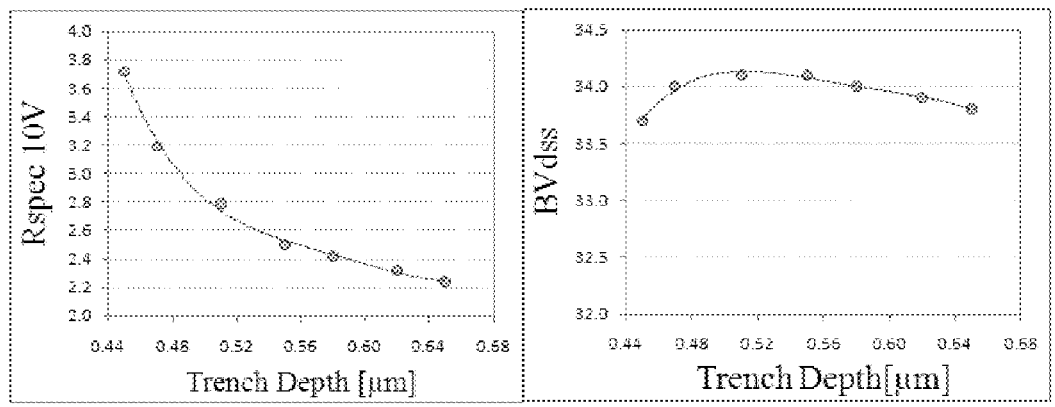
FIG. 5 shows simulation results to show the advantages of the invention.
FIG. 6 shows the effect of varying the depth of the additional trench in the design of the invention on the device characteristics.

FIG. 5 shows a summary of a simulation of the process of the invention. Transistor parameters are given for two known processes ("known1" and "known2"). The invention is implemented as a modification to the second known process, with two gate dielectric layer thicknesses (LS=33 nm and HS=38 nm). The LS 33 nm gate oxide corresponds to the Lowside transistor optimization and the HS corresponds 38 nm gate oxide corresponds to the Highside transistor optimization.

The values specified in FIG. 5 are:

RON at Vgs=4.5V is the on-state drain-source resistance of the device with an applied gate voltage of 4.5V;

RON at Vgs=10V is the on-state drain-source resistance of the device with an applied gate voltage of 10V;

BVdss is the breakdown voltage BV of the device when a drain voltage is applied relative to the source;

Vgstx is the threshold voltage of the device when conducting 1 mA of drain current relative to the source;

Qgd is the gate/drain charge;

Qgs is the gate/source charge;

Qgtot is the total charge of the MOSFET when a gate voltage of 4.5V is applied relative to the source;

Qgd FoM is a figure of merit and is equal to Qgd×RON;

Qgtot FoM is a figure of merit and is equal to Qgtot×RON.

The performance of the thicker gate oxide version of the invention (HS) is then compared with the two known processes ("known1" and "known2"). Note that no substrate resistances have been added to the specific RON values.

The advanced RESURF concept of the invention offers a marked improvement over the standard RESURF technology of FIG. 1 as well as the other test process. There is not just an improvement in the Figure of Merit but also in the actual Qgd and Qgtot (4.5 Vgs) parameter values. This can be contributed to the extra gate shielding afforded by the additional p-type pillar.

FIG. 6 shows how the device performance varies with trench depth. The specific on resistance value Rspec (the RON value multiplied by the active area of the device) and the BV value are plotted. FIG. 5 shows that the concept works over the trench depth range. The envisioned trench depth window is 0.55 µm±0.1 µm.

The processing parameters other than for the additional RESURF pillar have not been given in enormous detail, as these are all conventional and the same as employed in the structure of FIG. 1. The options will be apparent to those skilled in the art.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A trench-gate semiconductor device, comprising:
   a drain contact;
   a silicon semiconductor body over the drain contact which is doped with a first type of dopant;
   a gate trench formed in a top portion of the semiconductor body;
   a gate dielectric lining the gate trench;
   a gate electrode formed in the gate trench;
   source regions formed in the semiconductor body on opposite sides of the gate trench, separated from the gate electrode by the gate dielectric; and
   an implant well on each side of the gate trench, doped with a second type of dopant, of opposite polarity type to the first type of dopant of the semiconductor body, and extending more deeply into the semiconductor body than the gate trench,
   wherein the device further comprises
      a pillar region extending downwardly from a bottom of the gate trench and which is electrically connected to the source regions, doped with the second type of dopant beneath the gate trench between the implant wells, and
      an additional implant well connected to the source regions and to the pillar region and configured and arranged to bias the pillar region at a potential of the source regions.

2. A device as claimed in claim 1, further comprising:
   a contact region to the source regions, comprising a moat formed around the source regions extending into the top portion of the semiconductor body, wherein the additional implant well is further configured to electrically connect the pillar region to the source regions.

3. A device as claimed in claim 1, wherein the pillar region has a width of between 0.7 and 1.0 times the width of the gate trench.

4. A device as claimed in claim 1, wherein the pillar region extends to a depth which is substantially equal to the depth of the implant wells.

5. A device as claimed in claim 1, wherein the semiconductor body is doped n-type, the implant wells and the pillar region are doped p-type.

6. A device as claimed in claim 1, wherein the additional implant connects the pillar region to the implant well.

7. A device as claimed in claim 6, wherein the additional implant is provided at ends of the gate trench and comprises the second type of dopant.

8. The device of claim 1 further comprising:
   a moat in the top portion of the semiconductor body, above the implant well and both around and laterally outside the source regions, and
   a contact region in the moat and connected to the source regions.

9. The device of claim 1, wherein the additional implant well configured and arranged to electrically connect the pillar region to the implant well on each side of the gate trench, wherein the gate dielectric is configured and arranged to isolate the gate trench from the source region.

10. The device of claim 1, wherein the gate dielectric includes a first portion lining side walls of the gate trench and having a first thickness, and a second portion lining the bottom of the gate trench and having a second thickness that is larger than the first thickness.

11. The device of claim 1, wherein the additional implant well electrically connects the pillar region to the source region.

12. The device of claim 1, wherein the additional implant well extends under the gate trench.

* * * * *